(12) United States Patent
Baldwin et al.

(10) Patent No.: US 10,036,956 B2
(45) Date of Patent: Jul. 31, 2018

(54) METHOD OF MAKING RELIEF IMAGE PRINTING ELEMENTS

(71) Applicant: MacDermid Graphics Solutions, LLC, Waterbury, CT (US)

(72) Inventors: Kyle P. Baldwin, Acworth, GA (US); Jeremy Hogan, Atlanta, GA (US); Miguel Barboza, Fairburn, GA (US); Rogelio Sanchez, Fairburn, GA (US)

( * ) Notice: Subject to any disclaimer, the term of this patent is extended or adjusted under 35 U.S.C. 154(b) by 0 days.

(21) Appl. No.: 15/145,230

(22) Filed: May 3, 2016

(65) Prior Publication Data

US 2017/0322494 A1   Nov. 9, 2017

(51) Int. Cl.
  *G06F 7/20* (2006.01)
  *G03F 7/20* (2006.01)
  *B41C 1/00* (2006.01)

(52) U.S. Cl.
  CPC .......... *G03F 7/2004* (2013.01); *B41C 1/006* (2013.01)

(58) Field of Classification Search
  CPC ....................................................... G03F 7/20
  See application file for complete search history.

(56) References Cited

U.S. PATENT DOCUMENTS

| | | |
|---|---|---|
| 9,046,778 B2 | 6/2015 | Baldwin |
| 2008/0030569 A1* | 2/2008 | Sievers .............. B23K 26/0613 347/233 |
| 2009/0197513 A1* | 8/2009 | Gouch .................... B24B 19/22 451/54 |
| 2009/0290891 A1 | 11/2009 | Sievers |
| 2009/0294696 A1 | 12/2009 | Sievers |
| 2011/0122646 A1 | 5/2011 | Bickham et al. |
| 2012/0266767 A1 | 10/2012 | Klein et al. |
| 2013/0162967 A1 | 6/2013 | Sievers |
| 2013/0242276 A1* | 9/2013 | Schadebrodt ............ G03F 1/68 355/27 |
| 2014/0057207 A1* | 2/2014 | Baldwin ................ G03F 7/201 430/306 |
| 2015/0030984 A1 | 1/2015 | Ramakrishnan |
| 2015/0055915 A1 | 2/2015 | Logunov et al. |
| 2015/0062954 A1 | 3/2015 | Crossland et al. |
| 2015/0104141 A1 | 4/2015 | Logunov et al. |
| 2016/0131973 A1* | 5/2016 | Boukaftane ............ G03F 7/031 430/281.1 |

FOREIGN PATENT DOCUMENTS

| | | |
|---|---|---|
| CN | 101231474 | 7/2008 |
| EP | 2508948 | 10/2012 |
| EP | 2522439 | 11/2012 |

* cited by examiner

*Primary Examiner* — Chanceity Robinson
(74) *Attorney, Agent, or Firm* — Carmody Torrance Sandak & Hennessey LLP

(57) ABSTRACT

A method of flood exposing a photocurable printing blank to actinic radiation from a UV LED light source, wherein a high intensity UV LED light source is modulated to a lower intensity. The method includes the steps of: (a) positioning the photocurable printing blank in an exposure unit, wherein the exposure unit comprises one or more high intensity UV LED light sources; (b) modulating intensity of the one or more high intensity UV LED light sources to a lower intensity; and (c) flood exposing the photocurable printing blank through the photographic negative or the digitally imaged mask layer to actinic radiation from the one or more modulated UV LED light sources.

13 Claims, 2 Drawing Sheets

METHOD OF MAKING RELIEF IMAGE PRINTING ELEMENTS

FIELD OF THE INVENTION

The present invention relates generally to a method of making relief image printing elements.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of, in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefin, polyamides, and the like, including polyethylene terephthalate (PET), polyethylene naphthalate (PEN), and polybutylene terephthalate (PBT). The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. One widely used support layer is a flexible film of polyethylene terephthalate.

The photocurable layer(s) can include any of the known photopolymers, monomers, initiators, reactive or non-reactive diluents, fillers, processing aids, UV absorbers and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss et al., British Patent No. 1,366,769, U.S. Pat. No. 5,223,375 to Berrier et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen et al., U.S. Pat. No. 3,265,765 to Holden et al., U.S. Pat. No. 4,320,188 to Heinz et al., U.S. Pat. No. 4,427,759 to Gruetzmacher et al., U.S. Pat. No. 4,622,088 to Min, and U.S. Pat. No. 5,135,827 to Bohm et al., the subject matter of each of which is herein incorporated by reference in its entirety. More than one photocurable layer may also be used. The photocurable layer(s) may be applied directly on the support. In the alternative, the photocurable layer(s) may be applied on top of an adhesion layer and/or resilient under layer.

Photocurable materials generally cross-link (cure) and harden through radical polymerization in at least some actinic wavelength region. As used herein, "actinic radiation" is radiation that is capable of polymerizing, crosslinking or curing the photocurable layer. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. In the alternative, a negative may be placed directly on the at least one photocurable layer.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Thereafter, the at least one photocurable layer with the in situ negative thereon, is subjected to flood-exposure by UV light through the in situ negative. The areas exposed to the light cure, or harden, and the unexposed areas are removed (developed) to create the relief image on the printing plate. Selective exposure to the source of actinic radiation can be achieved using either the analog or digital method. Examples of laser ablatable layers are disclosed, for example, in U.S. Pat. No. 5,925,500 to Yang et al., and U.S. Pat. Nos. 5,262,275 and 6,238,837 to Fan, the subject matter of each of which is herein incorporated by reference in its entirety.

Processing steps for forming relief image printing elements typically include the following:

1) Image generation, which may be mask ablation for digital "computer to plate" printing plates or negative production for conventional analog plates;
2) Face exposure through the mask (or negative) to selectively crosslink and cure portions of the photocurable layer not covered by the mask, thereby creating the relief image;
3) Back exposure to create a floor layer in the photocurable layer and establish the depth of relief. It is preferred to face expose the plate before flipping it for back exposure. Doing the back exposure first may result in damaging the black mask during the plate handling, thus contributing to image degradation. Some exposing systems can also run both exposure systems simultaneously, which also preserves the image integrity;
4) Development to remove unexposed photopolymer by solvent (including water) or dry "thermal" development; and
5) If necessary, post exposure and detackification.

Removable coversheets may be provided to protect the photocurable printing element from damage during transport and handling. Useful cover sheets include flexible polymeric films, e.g., polystyrene, polyethylene, polypropylene, polycarbonate, fluoropolymers, polyamide or polyesters. Polyesters, especially polyethylene terephthalate, are commonly used.

Prior to processing the printing elements, the coversheet(s) are removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or thermal development) removes the unexposed areas of the photopolymerizable layer, leaving a printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Prior to the brief back exposure step (i.e., brief as compared to the imagewise exposure step), an imagewise exposure is performed utilizing a digitally-imaged mask or a photographic negative mask, which is in contact with the photocurable layer and through which actinic radiation is directed.

The type of radiation used is dependent in part on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units, photographic flood lamps, and, more recently, UV light emitting diodes (LEDs).

LEDs are semiconductor devices which use the phenomenon of electroluminescence to generate light. LEDs consist of a semiconducting material doped with impurities to create a p-n junction capable of emitting light as positive holes join with negative electrons when voltage is applied. The wavelength of emitted light is determined by the materials used in the active region of the semiconductor. Typical materials used in semiconductors of LEDs include, for example, elements from Groups (III) and (V) of the periodic table. These semiconductors are referred to as III-V semiconductors and include, for example, GaAs, GaP, GaAsP, AlGaAs, InGaAsP, AlGaInP and InGaN semiconductors. The choice of materials is based on multiple factors including desired wavelength of emission, performance parameters and cost.

It is possible to create LEDs that emit light anywhere from a low of about 100 nm to a high of about 900 nm. Currently, known UV LED light sources emit light at wavelengths between about 300 and about 475 nm, with 365 nm, 390 nm and 395 nm being common peak spectral outputs. When using LED light sources for curing photocurable compositions, the photoinitiator in the photocurable composition is selected to be responsive to the wavelength of light emitted by the LED light source.

LED offer several advantages over other sources of actinic radiation. For example, LEDs are instant on/off sources requiring no warm-up time, which contributes to LED lamps' low energy consumption. LEDs also generate much less heat, with higher energy conversion efficiency, have longer lamp lifetimes, and are essentially monochromatic, emitting a desired wavelength of light which is governed by the choice of semiconductor materials employed in the LED.

Curing devices that typically incorporate LEDs utilize high intensity UV LEDs arranged in an array or an assembly. For example, the UV LEDs may be arranged in a light bar, in which the light bar and the photocurable printing blank move relative to each other (i.e., the light bar travels over the printing or the plate travels under the light bar), in order to cure the entire plate surface, as described, for example, in U.S. Pat. Pub. No. 2012/0266767 to Klein et al., the subject matter of which is herein incorporated by reference in its entirety. Klein et al. describes both printing sleeves and flat printing plates that may be produced by moving a light exposure unit relative to a printing sleeve or planar printing plate and describes a light exposure unit that includes LED arrays and that the light exposure unit can be used to producing printing elements having flat tops and round tops on the same plate using a digital workflow. U.S. Pat. Pub. No. 2013/0242276 to Schadebrodt et al., the subject matter of which is herein incorporated by reference in its entirety, describes a method of producing flexographic printing elements including the steps of exposing the printing element to actinic light at a high intensity with a plurality of UV LEDs and then exposing the printing element to actinic light at a lower intensity from a UV radiation source other than UV-LEDs.

In order to perform the imagewise exposure step in a relatively short period of time, it is generally required that the light bar or other UV light assembly has a very high UV output of 1 W/cm$^2$ or greater at the plate surface. However, this approach is problematic because it can generate a lot of heat and the rapid cure of the polymer can cause the surface to contract or "cup." In addition, plates cured with high intensity UV LEDs can actually print with more gain that the same plate cured under a lower intensity UV LED.

SUMMARY OF THE INVENTION

It is an object of the present invention to provide a system for exposing photocurable printing blanks to actinic radiation from UV LEDs.

It is another object of the present invention to provide a system for exposing photocurable printing blanks to actinic radiation from UV LEDs that modulates high intensity UV LED light sources to a lower intensity.

It is still another object of the present invention to produce a printing plate with reduced print gain.

To that end, in one embodiment, the present invention relates generally to a method of flood exposing a photocurable printing blank to actinic radiation from a UV LED light source, the photocurable printing blank comprising a support, at least one photocurable layer upon the support, wherein the at least one photocurable layer is capable of being selectively crosslinked and cured upon exposure to actinic radiation at a desired wavelength and wherein the at least one photocurable layer comprises (a) at least one elastomeric binder, (b) at least one ethylenically unsaturated monomer, and (c) a photoinitiator having a favorable absorption profile in the desired wavelength region used for exposing the at least one photocurable layer to actinic radiation, and a photographic negative or digitally imaged mask layer disposed on the at least one photocurable layer; the method comprising the steps of:

a) positioning the photocurable printing blank in an exposure unit, wherein the exposure unit comprises one or more high intensity UV LED light sources;
b) modulating intensity of the one or more high intensity UV LED light sources to a lower intensity; and
c) flood exposing the photocurable printing blank through the photographic negative or the digitally imaged mask layer to actinic radiation from the one or more modulated UV LED light sources;

wherein portions of the at least one photocurable layer not covered by the photographic negative or digitally imaged mask layer crosslink and cure to create the relief image therein.

DETAILED DESCRIPTION OF THE PREFERRED EMBODIMENTS

Figure 1:
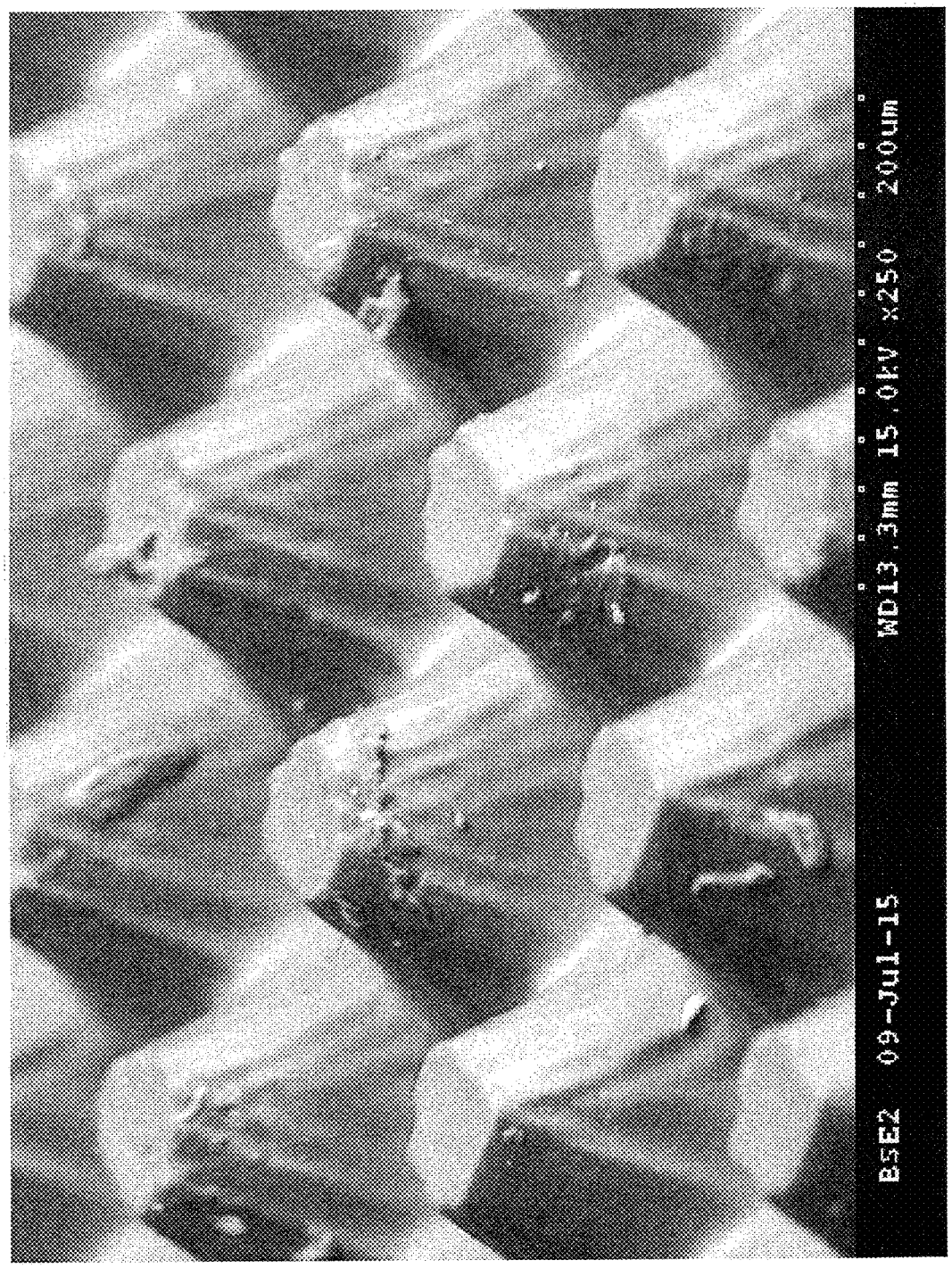
FIG. 1 depicts a SEM of relief printing dots produced in accordance with one aspect of the present invention.

The present invention relates generally to flood exposing photocurable printing blanks to actinic radiation from modulated UV LED light sources to crosslink and cure portions of the photocurable printing element and produce the desired relief image therein. While the present invention is described with respect to UV LEDs, the present invention is also usable with other high intensity UV light sources that can be modulated to a lower intensity and which can be used to flood expose the photocurable printing blank. In a general sense, the present invention is relevant to flood exposing of photocurable printing blanks to high intensity UV light sources that have been modulated to a lower intensity.

Based thereon, the present invention relates generally to a method of flood exposing a photocurable printing blank to actinic radiation from a UV LED light source, the photocurable printing blank comprising a support, at least one photocurable layer upon the support, wherein the at least one photocurable layer is capable of being selectively crosslinked and cured upon exposure to actinic radiation at a desired wavelength and wherein the at least one photocurable layer comprises (a) at least one elastomeric binder, (b) at least one ethylenically unsaturated monomer, and (c) a photoinitiator having a favorable absorption profile in the desired wavelength region used for exposing the at least one photocurable layer to actinic radiation, and a photographic negative or digitally imaged mask layer disposed on the at least one photocurable layer; the method comprising the steps of:

a) positioning the photocurable printing blank in an exposure unit, wherein the exposure unit comprises one or more high intensity UV LED light sources;
b) modulating intensity of the one or more high intensity UV LED light sources to a lower intensity; and
c) flood exposing the photocurable printing blank through the photographic negative or the digitally imaged mask layer to actinic radiation from the one or more modulated UV LED light sources;

wherein portions of the at least one photocurable layer not covered by the photographic negative or digitally imaged mask layer crosslink and cure to create the relief image therein.

In one embodiment, the source of actinic radiation is a high intensity UV light source. Preferably, the high intensity UV light source comprises one or more UV LED light sources, each having an output of at least 200 mW/cm$^2$, more preferably an output of at least 500 mW/cm$^2$, or even at least 1 W/cm$^2$ at the plate surface. The high intensity UV LED is modulated to reduce the output to less than 200 mW/cm$^2$, more preferably less than 100 mW/cm$^2$, and most preferably less than 20 mW/cm$^2$ at the plate surface. The intensity of the UV LEDs at the level of the plate surface is measured using a suitable calibrated UV measuring device.

There are various ways that the high intensity UV light source can be modulated to a lower intensity including, for example, (1) arranging the high intensity UV LED light sources at a suitable distance from a surface of the photocurable printing blank; (2) using light diffusing optical fibers; and (3) mounting a light bar comprising a plurality of high intensity UV LEDs within a series of reflective mirrors. Other methods of modulating the intensity of the one or more high intensity UV LED light sources would also be usable in the practice of the invention.

As described herein, the one or more high intensity UV LED light sources may be modulated by arranging several high intensity UV LED diodes in an array over the exposure area and suspending the array of LED diodes at a suitable distance from the surface of the photocurable printing blank. The high intensity UV LED diodes arranged so that they can flood expose the entire surface area of the photocurable printing blank to actinic radiation. What is meant by "flood exposure" is that substantially the entire surface of the photocurable printing blank is exposed to actinic radiation at the same time. The UV LED diodes or arrays may be suspended at a distance of between about 2 inches and about 20 inches from the surface of the flexographic printing blank, more preferably at a distance of between about 2 and about 12 inches from the surface of the photocurable printing blank.

The inventors have found that by arranging the UV LED light sources at a distance from the surface of the photocurable printing blank, that the resulting intensity of the actinic radiation at the surface of the photocurable printing blank is lowered. Thus, the intensity of the high intensity UV LED light sources is modulated so that the intensity at the surface of the photocurable printing blank is much lower. In contrast, U.S. Pat. Pub. No. 2013/0242276 to Schadebrodt et al. depicts a prior art system in which the distance of the UV LEDs from the surface of the photocurable printing blank is only about 2 mm to about 10 mm and the intensity of the UV LEDs at the surface of the photocurable printing blank is much higher. The system of Schadebrodt also travels over the surface of the photocurable printing blank and does not subject the surface to a flood exposure as described herein.

Another way of modulating the intensity of the UV LED diodes is by coupling one or more UV LED diodes to a plurality of strands of light diffusing fibers. These light diffusing fibers may be spread over the exposure area and illuminated with one or more high intensity UV LEDs or lasers. Light diffusing optical fibers are optical fibers that emit light from surfaces along the length of the fiber, rather than only propagating light along the axis of the fiber, as described, for example, in U.S. Pat. Pub. No. 2015/0104141 to Logunov et al., the subject matter of which is herein incorporated by reference in its entirety. One of the advantages of light diffusing fibers is their ability to provide uniform illumination along the length of the light diffusing fiber.

Light diffusing optical fibers typically include a core region which also comprises a scattering region, which may comprise scattering particles, such as gas filled voids or particles such as micro- or nano-particles of ceramic materials included in the fiber core. The core portion may comprise a silica-based glass. The scattering particles are used to scatter light propagating in the core of the light diffusing optical fiber such that the light is directed radially outward from the core, thereby illuminating the light diffusing optical fiber and the space surrounding the light diffusing optical fiber. The nano-sized structures scatter light away from the core and toward the outer surface of the fibers. The scattered light is then diffused through the outer surface of the fiber to provide the desired illumination. Thus, most of the light is diffused, via scattering, through the sides of the fiber, along the length of the fiber.

The light diffusing optical fiber may also include a cladding which surrounds and is direct contact with the core portion and is made of a material having a lower index of refraction than the material of the core region. The scattering particles are used to scatter or diffuse light out of the sides of the fiber, such that light is guided away from the core of optical fiber and through the outer surfaces of the optical fiber to provide illumination.

Light diffusing optical fibers can be bundled together in a tight bundle with space between the cores, or are otherwise arranged in a suitable manner, and are then coupled to one or more high intensity UV LEDs or high intensity lasers. The light diffusing optical fibers are coupled to an output end of a high intensity UV LED or high intensity laser. The output end of the UV LED light source emits UV light which is dispersed through each of the light diffusing optical fibers in the bundle of light diffusing optical fibers.

The light diffusing optical fibers modulate the intensity of the high intensity UV LED light source. The light diffusing optical fibers can provide scattering UV light over substantially the entire surface area of the photocurable printing blank so that the light diffusing optical fibers can subject the photocurable printing blank to a flood exposure of actinic radiation through the photographic negative or the digital mask layer. The light diffusing optical fibers may have a length in the range of up to about 50 meters. However, it is generally preferred that the light diffusing optical fibers have a length that is substantially equally to or at least slightly exceeds the maximum dimension of a photocurable printing blank that is to be processed in the exposure unit. Thus, the light diffusing optical fibers may be coupled to an output end of one or more high intensity LED light sources or high intensity lasers and stretched over the source of the photocurable printing blank. While various arrangements of light diffusing optical fibers can be used in the exposure unit described herein, the light diffusing optical fibers must be arranged so as to provide a substantially uniform intensity of actinic radiation over the entire surface of the photocurable printing blank to crosslink and cure the photocurable printing blank and create the relief image therein.

The plurality of optical fibers are each coupled to a light source, which is typically a laser, an LED or LED array, or other component capable of electromagnetic radiation in the UV range. Thus, the plurality of light diffusing optical fibers scatter or diffuse UV light at the wavelength of the particular photoinitiator to crosslink and cure portions of the layer of photocurable material and create the relief image therein.

Still another way of modulating intensity of a high intensity UV LED light source is to mount a high intensity UV LED light bar within a series of reflective mirrors oriented so that the mirrors direct the light equally down onto the entirety of the surface of the plate or platen. The inventors have also found that the shape of the dots can be controlled by altering the angle of the mirrors. Thus, the UV LED light bar may be disposed at a top of a mirrored box and the photocurable printing blank exposed to a static exposure of actinic radiation from the UV LED light bar through the mirrored box. By static exposure, what is meant is that the photocurable printing blank is at least substantially simultaneously exposed to actinic radiation at one time from the actinic radiation emanating from the UV LED light bar.

As described herein, the mirrors within the mirrored box can be angled so as to control the shape of the relief printing dots produced. In one embodiment, the mirrored box is controlled by a controller that is capable of changing the angle of the mirrors in the mirrored box. Thus, the mirrors may be angled within the mirror box at angle between about 60 degrees and about 110 degrees, as measured from vertical, more preferably from about 70 degrees to about 90 degrees as measured from the vertical.

Figure 2:
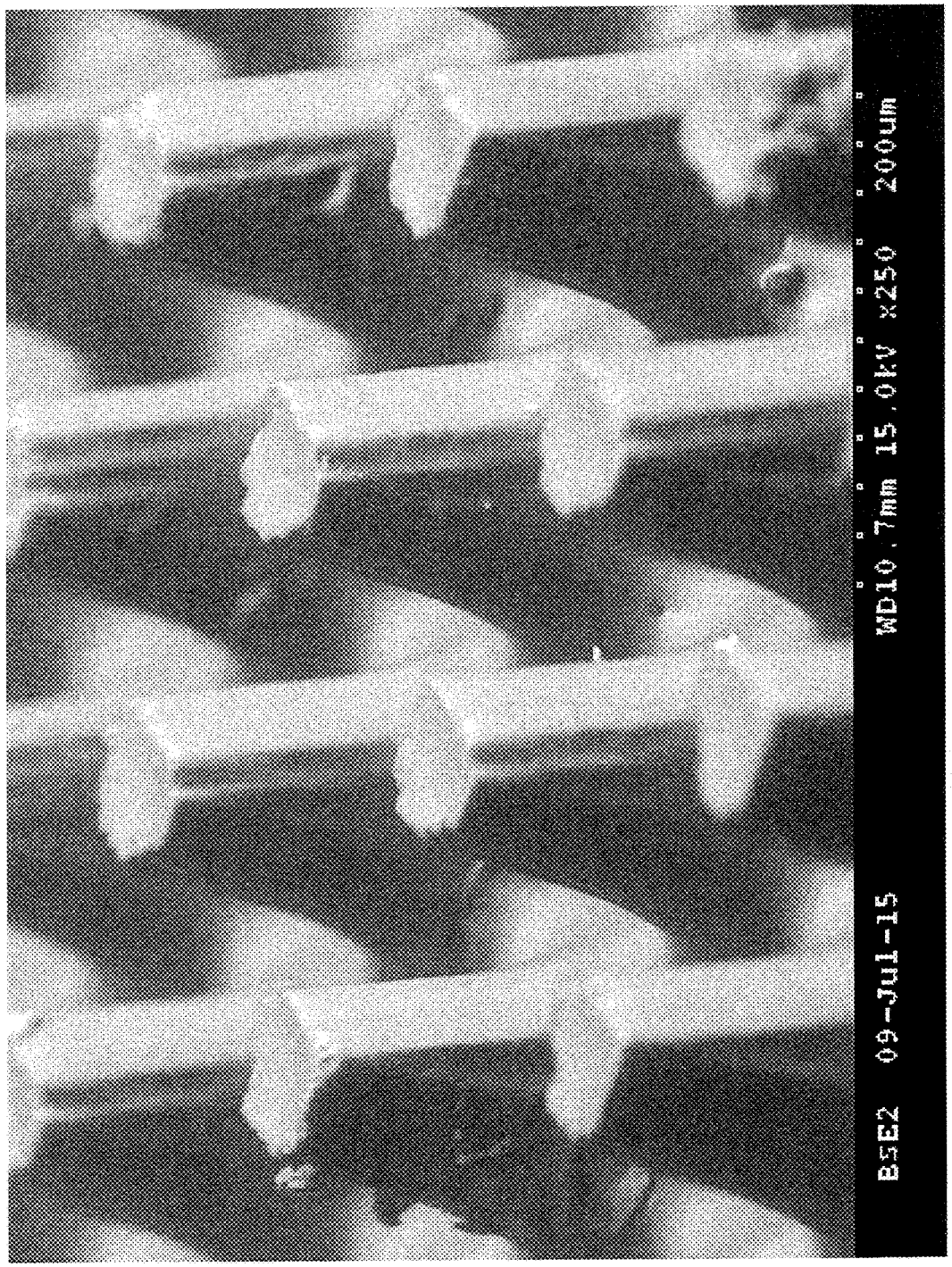
FIG. 2 depicts a SEM of relief printing dots produced in accordance with another aspect of the present invention.

For example, when the mirrors are arranged at about 90 degrees from vertical, the shape of the dots has a broad slope, as shown in FIG. 1. On the other hand, when the mirrors are arranged at about 70 degrees from vertical, the dots have a much steeper slope as shown in FIG. 2. Thus, by modifying the angle of the mirrors, dots can be produced having different slopes. Thus, it is further contemplated that the mirror box may be operatively connected to a controller that is capable of changing the angle of the mirrors arranged inside of the mirror box so that different shaped dots may be produced. Thus, the mirrors in the mirror box may be movable to optimize the shape of the printing dots produced during the imagewise exposure step. In addition, by controlling the angle of the mirrors in the mirror box, the shape of the printing dots can be changed from exposure to exposure.

While it is generally preferred that all of the mirrors inside of the mirror box are arranged at the same angle, it is also contemplated that it may be desirable in some situations for the plurality of mirrors in the mirror box to be arranged at different angles, for example where it may be desirable to produce dots that have an oblong shape instead of a more rounded shape.

In the alternative, the mirrors may be fixedly mounted in the mirror box at a desired angle that has been calculated to produce the desired printing dot structure and configuration.

In all of these embodiments, it is possible to modulate the high intensity light UV LED source to a lower intensity that can be used to flood expose the photocurable printing blank to actinic radiation to crosslink and cure at least portions of the photocurable printing blank and create the desired relief image therein. Thus, in the present invention, the modulated UV LED light source and the photocurable printing blank do not move relative to each other during the flood exposure step. Instead, both the modulated UV LED light source described herein and the photocurable printing blank are fixed relative to each other during the exposure step, allowing the modulated UV LED light source to crosslink and cure portions of the photocurable printing blank and create the relief image therein.

The photocurable layer(s) can include any of the known elastomeric binders, monomers, photoinitiators, reactive or non-reactive diluents, fillers, processing aids, UV absorbers and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material.

Elastomeric binders are generally known to those skilled in the art, including, for example, styrene-diene block copolymers, ethylene-acrylic acid copolymers, polyethylene oxide-polyvinyl alcohol graft copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber, and ethylene-propylene-diene rubber (EPDM), among others.

The elastomeric binder is preferably a thermoplastically elastomeric block copolymer of alkenylaromatics and 1,3-dienes and may be a linear, branched, or radial block copolymer. Suitable examples include triblock copolymers of the A-B-A type, diblock polymers of the A-B type, or copolymers having two or more alternating elastomeric and thermoplastic blocks, e.g., A-B-A-B-A, and combinations of one or more of the foregoing. The total amount of binder in the photocurable layer(s) is typically in the range of about 40% to 90% by weight, based on the total weight of the photocurable composition, more preferably 45% to 75% by weight.

The photocurable composition also comprises at one ethylenically unsaturated compound that is compatible with the elastomeric binder(s). Suitable compounds have at least one ethylenically unsaturated double bond and are polymerizable. These ethylenically unsaturated compounds (also referred to as monomers) include, for example, esters or amides of acrylic acid or of methacrylic acid with mono- or polyfunctional alcohols, amines, amino alcohols or hydroxylethers and hydroxyl esters, esters of fumaric or maleic acid, vinyl ethers, vinyl esters, or allyl compounds, among others. Preferred examples of suitable monomers include butyl acrylate, 2-ethylhexyl acrylate, lauryl acrylate, tetradecyl acrylate, 1,4-butanediol diacrylate, 1,6-hexanediol diacrylate, 1,6-hexanediol dimethacrylate, 1,9-nonanediol diacrylate, trimethylolpropane tri(meth)acrylate, dioctyl fumarate, and N-dodecylmaleimide, and combinations of one or more of the foregoing. The amount of monomer in the photocurable composition is preferably less than about 25% by weight, preferably between about 5% and about 20% by weight, based on the total weight of the photocurable composition.

The photocurable composition also includes a photoinitiator having a favorable absorption profile in the desired LED wavelength region. The amount of photoinitiator in the photocurable composition is typically in the range of from about 0.1% to 5% by weight, based on the total weight of the photocurable composition.

The photocurable composition may also optionally contain one or more plasticizers. Examples of suitable plasticizers include modified and unmodified natural oils and natural resins, such as high-boiling paraffinic, naphthenic, or aromatic mineral oils, synthetic oligomers or resins such as oligostyrene, high-boiling esters, oligomeric styrene-butadiene copolymers, oligomeric a-methylstyrene/p-methylstyrene copolymers, liquid oligobutadienes, or liquid oligomeric acrylonitrile-butadiene copolymers or oligomeric ethylene-propylene-diene copolymers, among others. Preference is given to polybutadiene oils, more particularly those having a molecular weight of between 500 and 5000 g/mol, high-boiling aliphatic esters such as, more particularly, esters of alkylmonocarboxylic and dicarboxylic acids, examples being stearates or adipates, and mineral oils. The amount of an optionally present plasticizer is preferably in the range of about 0% to 50% by weight, based upon the total weight of the photocurable composition.

The photocurable composition may also contain various fillers, processing aids, UV absorbers and dyes.

Thereafter, once the photocurable printing blank has been imagewise exposed to actinic radiation, it is developed to remove unexposed, and thus uncured, photopolymer and reveal the relief image therein. Development may include solvent (including water) or dry "thermal" development. Thereafter, various post exposure steps may be performed.

It should also be understood that the following claims are intended to cover all of the generic and specific features of the invention described herein and all statements of the scope of the invention that as a matter of language might fall therebetween.

What is claimed is:

1. A method of flood exposing a photocurable printing blank to actinic radiation from a UV LED light source, the photocurable printing blank comprising a support, at least one photocurable layer upon the support, wherein the at least one photocurable layer is capable of being selectively cross-linked and cured upon exposure to actinic radiation and wherein the at least one photocurable layer comprises (a) at least one elastomeric binder, (b) at least one ethylenically unsaturated monomer, (c) a photoinitiator having a favorable absorption profile in a wavelength region used for exposing the at least one photocurable layer to actinic radiation, wherein the wavelength region is between 300 and 475 nm, and a photographic negative or digitally imaged mask layer disposed on the at least one photocurable layer; the method comprising the steps of:
   a) positioning the photocurable printing blank in an exposure unit, wherein the exposure unit comprises one or more high intensity UV LED light sources, wherein the one or more high intensity UV LED light sources have an intensity of at least 200 mW/cm$^2$;
   b) modulating intensity of the one or more high intensity UV LED light sources to a lower intensity, wherein the modulated intensity is less than 100 mW/cm$^2$ at the surface of the photocurable printing blank; and
   c) flood exposing the photocurable printing blank through the photographic negative or the digitally imaged mask layer to actinic radiation from the one or more modulated UV LED light sources;
   wherein portions of the at least one photocurable layer not covered by the photographic negative or digitally imaged mask layer crosslink and cure to create a relief image therein;
   wherein the one or more high intensity UV LED light sources are modulated by mounting a light bar comprising a plurality of high intensity UV LEDs within a series of reflective mirrors;
   wherein the light bar is mounted at a top of a mirrored box and wherein the mirrored box and the photocurable printing blank do not move relative to each other during the flood exposure step.

2. The method according to claim 1, wherein the one or more high intensity UV LED light sources each have an output intensity of at least 500 mW/cm$^2$.

3. The method according to claim 1, wherein the modulated intensity is less than 20 mW/cm$^2$ at the surface of the photocurable printing blank.

4. A method of flood exposing a photocurable printing blank to actinic radiation from a UV LED light source, the photocurable printing blank comprising a support, at least one photocurable layer upon the support, wherein the at least one photocurable layer is capable of being selectively cross-linked and cured upon exposure to actinic radiation and wherein the at least one photocurable layer comprises (a) at least one elastomeric binder, (b) at least one ethylenically unsaturated monomer, (c) a photoinitiator having a favorable absorption profile in a wavelength region used for exposing the at least one photocurable layer to actinic radiation, wherein the wavelength region is between 300 and 475 nm, and a photographic negative or digitally imaged mask layer disposed on the at least one photocurable layer; the method comprising the steps of:

a) positioning the photocurable printing blank in an exposure unit, wherein the exposure unit comprises one or more high intensity UV LED light sources, wherein the one or more high intensity UV LED light sources have an intensity of at least 200 mW/cm$^2$;

b) modulating intensity of the one or more high intensity UV LED light sources to a lower intensity, wherein the modulated intensity is less than 100 mW/cm$^2$ at the surface of the photocurable printing blank; and c) flood exposing the photocurable printing blank through the photographic negative or the digitally imaged mask layer to actinic radiation from the one or more modulated UV LED light sources;

wherein portions of the at least one photocurable layer not covered by the photographic negative or digitally imaged mask layer crosslink and cure to create a relief image therein;

wherein the one or more high intensity UV LED light sources are modulated by arranging the one or more high intensity UV LED light sources at a distance at a distance of from 2 inches to 20 inches from the surface of the photocurable printing blank.

5. The method according to claim 1, wherein the photocurable printing blank is exposed to a static exposure of actinic radiation from the UV LED light sources mounted in the light bar through the mirrored box.

6. The method according to claim 1, wherein the series of reflective mirrors direct light equally down onto an entirety of the surface of the photocurable printing blanks.

7. The method according to claim 1, wherein the mirrors in the mirrored box are angled, wherein a shape of relief printing dots is controlled.

8. The method according to claim 7, wherein the angle of the mirrors in the mirrored box is between 60 degrees and 110 degrees, as measured from vertical.

9. The method according to claim 8, wherein the angle of the mirrors in the mirrored box is between 70 degrees and 90 degrees, as measured from vertical.

10. The method according to claim 1, wherein the mirrored box is operatively connected to a controller, wherein the controller controls the angle of the mirrors in the mirrored box.

11. The method according to claim 4, wherein the one or more high intensity UV LED light sources are arranged at a distance of from 2 inches to 12 inches from the surface of the photocurable printing blank.

12. The method according to claim 4, wherein the one or more high intensity UV LED light sources each have an output intensity of at least 500 mW/cm$^2$.

13. The method according to claim 4, wherein the modulated intensity is less than 20 mW/cm$^2$ at the surface of the photocurable printing blank.

\* \* \* \* \*